（12） United States Patent
Kim et al.

(10) Patent No.: US 9,053,776 B2
(45) Date of Patent: Jun. 9, 2015

(54) SETTING INFORMATION STORAGE CIRCUIT AND INTEGRATED CIRCUIT CHIP INCLUDING THE SAME

(71) Applicant: SK hynix Inc., Gyeonggi-do (KR)

(72) Inventors: Kwanweon Kim, Gyeonggi-do (KR);
Hyunsu Yoon, Gyeonggi-do (KR);
Jeongtae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 370 days.

(21) Appl. No.: 13/672,493

(22) Filed: Nov. 8, 2012

(65) Prior Publication Data

US 2014/0126319 A1   May 8, 2014

(51) Int. Cl.
*G11C 7/20* (2006.01)
*G11C 8/10* (2006.01)
*G11C 8/12* (2006.01)
*G11C 29/00* (2006.01)
*G11C 29/44* (2006.01)

(52) U.S. Cl.
CPC .. *G11C 7/20* (2013.01); *G11C 8/10* (2013.01);
*G11C 8/12* (2013.01); *G11C 2029/4402* (2013.01)

(58) Field of Classification Search
CPC ............. G11C 8/10; G11C 8/12; G11C 7/20;
G11C 2029/4402
USPC ........................... 365/230.06, 230.02, 230.03
See application file for complete search history.

(56) References Cited

U.S. PATENT DOCUMENTS

| 5,043,945 | A  | * | 8/1991 | Bader | 365/190 |
| 2004/0264278 | A1 | * | 12/2004 | Ahn et al. | 365/230.03 |
| 2007/0266279 | A1 | * | 11/2007 | Kawano | 714/721 |

* cited by examiner

*Primary Examiner* — J. H. Hur
(74) *Attorney, Agent, or Firm* — IP & T Group LLP

(57) ABSTRACT

A setting information storage circuit includes first decoders configured to generate first input enable signals, respectively, in response to selection codes and a first set signal, first register sets configured to correspond to the first decoders, respectively, and to receive setting data when first input enable signals generated from the first decoders corresponding to the first register sets, respectively, are enabled, and store the received setting data, a second decoders configured to generate a second input enable signals, respectively, in response to the selection codes and a second set signal, and a second register sets configured to correspond to the second decoders, respectively, and to receive the setting data when second input enable signals generated from the second decoders corresponding to the second register sets, respectively, are enabled, and store the received setting data.

4 Claims, 4 Drawing Sheets

SETTING INFORMATION STORAGE CIRCUIT AND INTEGRATED CIRCUIT CHIP INCLUDING THE SAME

BACKGROUND

1. Field

Exemplary embodiments of the present invention relate to setting information storage circuits for storing setting information for various settings within an integrated circuit chip.

2. Description of the Related Art

An integrated circuit chip requires various settings for a normal operation after the chip is fabricated. For example, only when settings for voltage levels used in an integrated circuit chip and settings for delay values of a delay circuit included in the integrated circuit chip are correctly performed, the integrated circuit chip may operate in an optimal environment. Furthermore, a variety of environments necessary for a test are set, and the test for an integrated circuit chip is performed. As described above, most of integrated circuit chips include a variety of setting circuits for setting operation mode, the voltage levels, and delay values.

FIG. 1 is a diagram illustrating a setting circuit included within a conventional integrated circuit chip.

Referring to FIG. 1, the integrated circuit chip includes a selection code transfer bus 101, a setting data transfer bus 102, a set signal transfer line 103, a reset signal transfer line 104, a plurality of decoders 110_0 to 110_N, a plurality of register sets 120_0 to 120_N, and a plurality of internal circuits 130_0 to 130_N.

The selection code transfer bus 101 transfers external selection codes SEL<0:A> received from a source other than the integrated circuit chip. The selection codes SEL<0:A> designate that external setting data DATA<0:B> received from a source other than the integrated circuit chip to be stored in one of the plurality of register sets 120_0 to 120_N. The setting data transfer bus 102 transfers the external setting data DATA<0:B>. The setting data DATA<0:B> is stored in a register set that is selected in response to the selection codes SEL<0:A>. The set signal transfer line 103 transfers an external set signal SET received from a source other than the integrated circuit chip. Furthermore, the reset signal transfer line 104 transfers an external reset signal RST received from a source other than the integrated circuit chip. The set signal SET includes timing information that designates a time at which setting data starts being inputted to a register set selected in response to the selection codes SEL<0:A>. The reset signal RST includes timing information that designates a time at which the setting data DATA<0:B> starts being inputted to a register set selected in response to the selection codes SEL<0:A>.

The decoders 110_0 to 110_N generate input enable signals EN_0 to EN_N in response to the selection codes SEL<0:A>, the set signal SET, and the reset signal RST. If the selection codes SEL<0:A> has a corresponding value to one of the decoders 110_0 to 110_N, one of the decoders 110_0 to 110 N enables the respective input enable signals EN_0 to EN_N in response to the enabling of the set signal SET and disable the respective input enable signals EN_0 to EN_N in response to the enabling of the reset signal RST. For example, assuming that the number of decoders 110_0 to 110_N is 8 (that is, N=7) and the selection codes SEL<0:A> have 3 bits (that is, A=2), if the selection codes SEL<0:2> have a value of '000', the decoder 110_0 enables the input enable signal EN_0 in response to the enabling of the set signal SET and disables the input enable signal EN_0 in response to the enabling of the reset signal RST. Furthermore, if the selection codes SEL<0: 2> have a value of '010', the decoder 110_2 enables the input enable signal EN_2 in response to the enabling of the set signal SET and disables the input enable signal EN_2 in response to the enabling of the reset signal RST.

The register sets 120_0 to 120_N receive and store the setting data DATA<0:B> loaded onto the setting data transfer bus 102 while the respective input enable signals EN_0 to EN_N are enabled. For example, while the input enable signal EN_1 is enabled, the setting data DATA<0:B>, which is loaded onto the setting data transfer bus 102, is stored in the register set 120_1. While the input enable signal EN_3 is enabled, the setting data DATA<0:B>, which is loaded onto the setting data transfer bus 102, is stored in the register set 120_3.

The internal circuits 130_0 to 130_N perform setting necessary for respective operations by using setting data stored in respective register sets. For example, if the internal circuit 130_0 is a circuit for setting the operation mode of the integrated circuit chip, the internal circuit 130_0 may set the operation mode of the integrated circuit chip in mode A or mode B by using setting data stored in the register set 120_0. Furthermore, if the internal circuit 130_1 is a circuit for generating an internal voltage used in the integrated circuit chip, the internal circuit 130_1 may set the level of the internal voltage by using setting data stored in the register set 120_1. Furthermore, if the internal circuit 130_2 is a delay circuit for delaying a specific signal, the internal circuit 130_2 may set a delay value by using setting data stored in the register set 120_2.

The setting method used in the above-described integrated circuit chip is performed in such a manner that a setting item is selected in response to the selection codes SEL<0:A>, and setting information DATA<0:B> is inputted to the selected setting item. Accordingly, the number of items that may be set varies depending on the number of bits of the selection codes SEL<0:A>. In order to increase the number of items that may be set in this setting method, the number of bits of the selection codes SEL<0:A> has to be increased. If the number of bits of the selection codes SEL<0:A> is increased, however, there are concerns in that an area of the selection code transfer bus 101 must be increased and the design of the decoders 110_0 to 110_N must be changed. In particular, in the case of an integrated circuit chip in which the number of bits of the selection codes SEL<0:A> is determined in accordance with standards, such as JEDEC and IEEE, there is a concern in that an increase in the number of bits of the selection codes SEL<0:A> may violate the standards. Accordingly, there is a need for technology that can increase the number of items that may be set without increasing the number of bits of the selection codes SEL<0:A> and changing the design of the decoder 110_0 to 110_N.

SUMMARY

Exemplary embodiments of the present invention are directed to providing technology that may increase the number of settings that may be set without increasing the number of bits of selection codes or changing the construction of decoders.

In accordance with an embodiment of the present invention, a setting information storage circuit includes a plurality of first decoders configured to generate a plurality of first input enable signals, respectively, in response to selection codes and a first set signal, a plurality of first register sets configured to correspond to the plurality of first decoders, respectively, and to receive setting data when the first input enable signals generated from the first decoders corresponding to the first register sets, respectively, are enabled, and to store the received setting data, a plurality of second decoders configured to generate a plurality of second input enable signals, respectively, in response to the selection codes and a second set signal, and a plurality of second register sets configured to correspond to the plurality of second decoders, respectively, and to receive the setting data when the second input enable signals generated from the second decoders corresponding to the plurality of second register sets, respectively, are enabled, and to store the received setting data.

In accordance with another embodiment of the present invention, an integrated circuit chip includes a selection code transfer bus configured to transfer selection codes, a setting data transfer bus configured to transfer setting data, a first line configured to transfer a first set signal, a second line configured to transfer a second set signal, a plurality of first decoders configured to generate a plurality of first input enable signals, respectively, in response to the selection codes and a first set signal, a plurality of first register sets configured to correspond to the plurality of first decoders, respectively, and to receive the setting data when the first input enable signals generated from the first decoders corresponding to the first register sets, respectively, are enabled, and to store the received setting data, a plurality of second decoders configured to generate a plurality of second input enable signals, respectively, in response to the selection codes and the second set signal, and a plurality of second register sets configured to correspond to the plurality of second decoders, respectively, and to receive the setting data when the second input enable signals generated from the plurality of second decoders corresponding to the second register sets, respectively, are enabled, and to store the received setting data.

DETAILED DESCRIPTION

Figure 1:
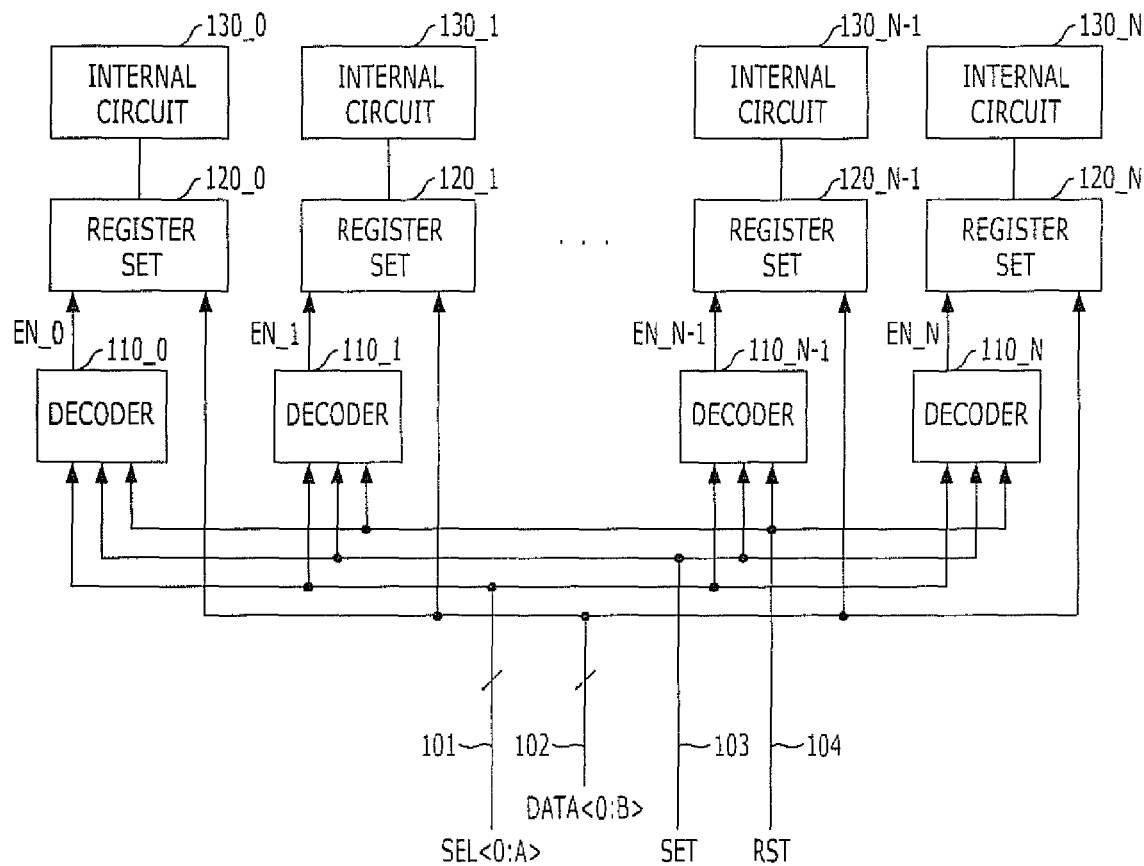
FIG. 1 is a diagram illustrating a setting circuit included within a conventional integrated circuit chip.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
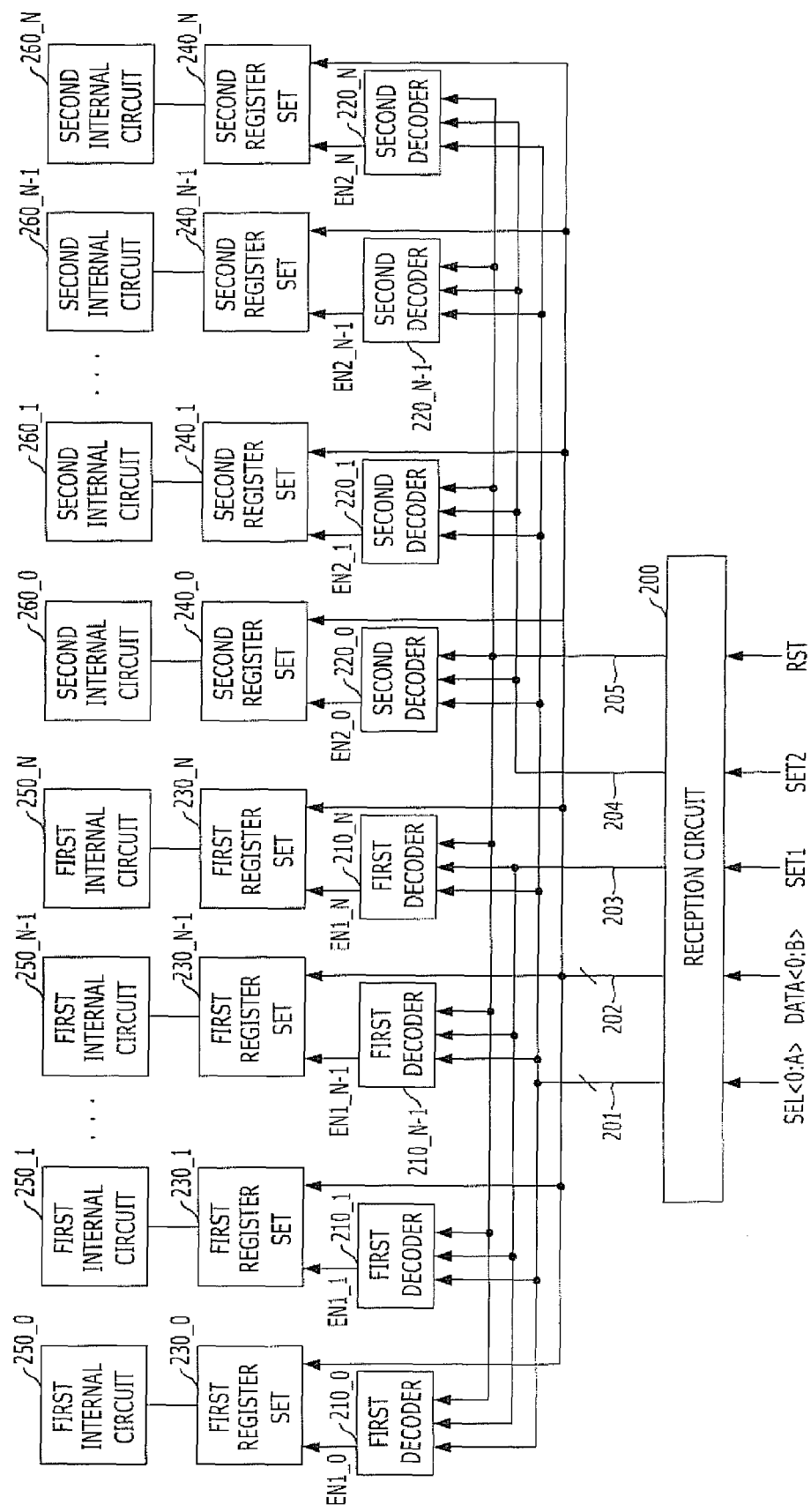
FIG. 2 illustrates a block diagram of an integrated circuit chip including a setting information storage circuit in accordance with one embodiment of the present invention.

FIG. 2 illustrates a block diagram of an integrated circuit chip including a setting information storage circuit in accordance with one embodiment of the present invention.

Referring to FIG. 2, the integrated circuit includes a reception circuit 200, a selection code transfer bus 201, a setting data transfer bus 202, a first set signal transfer line 203, a second set signal transfer line 204, a reset signal transfer line 205, a plurality of first decoders 210_0 to 210_N, a plurality of second decoders 220_0 to 220_N, a plurality of first register sets 230_0 to 230_N, a plurality of second register sets 240_0 to 240_N, a plurality of first internal circuits 250_0 to 250_N, and a plurality of second internal circuits 260_0 to 260_N.

The reception circuit 200 receives selection codes SEL<0:A>, setting data DATA<0:B>, a first set signal SET1, a second set signal SET2, and a reset signal RST, all of which are externally received from a source other than the integrated circuit chip.

The selection code transfer bus 201 transfers the external selection codes SEL<0:A> received from a source other than the integrated circuit chip. The selection codes SEL<0:A> designate that the external setting data DATA<0:B> received from a source other than the integrated circuit chip has to be stored in which one of the register sets 230_0 to 230_N and 240_0 to 240_N. The selection codes SEL<0:A> are shared by all the decoders 210_0 to 210_N and 220_0 to 220_N within the integrated circuit, and thus, the selection code transfer bus 201 is connected to all the decoders 210_0 to 210_N and 220_0 to 220_N.

The setting data transfer bus 202 transfers the external setting data DATA<0:B> received from a source other than the integrated circuit chip. The setting data DATA<0:B> is stored in a register set selected in response to the selection codes SEL<0:A> and the set signals SET1 and SET2. All the register sets 230_0 to 230_N and 240_0 to 240_N within the integrated circuit chip receive the setting data DATA<0:B> through the setting data transfer bus 202 and store the received setting data DATA<0:B>, and thus, the setting data transfer bus 202 is connected to all the register sets 230_0 to 230_N and 240_0 to 240_N.

The first set signal transfer line 203 transfers the first set signal SET1, which is received from a source other than the integrated circuit chip, as a set signal used in the first decoders 210_0 to 210_N. In an exemplary embodiment, the first set signal SET1 is used in the first decoders 210_0 to 210_N, but is not used in the second decoders 220_0 to 220_N. Thus, the first set signal transfer line 203 is connected to the first decoders 210_0 to 210_N only. The second set signal transfer line 204 transfers the second set signal SET2, received from a source other than the integrated circuit chip, as a set signal used in the second decoders 220_0 to 220_N. The second set signal transfer line 204 is connected to the second decoders 2200 to 220_N.

The reset signal transfer line 205 transfers the reset signal RST, received from a source other than the integrated circuit chip, to the first decoders 210_0 to 210_N and the second decoders 220_0 to 220_N. The reset signal transfer line 205 is connected to all the decoders 210_0 to 210_N and 220_0 to 220_N within the integrated circuit chip.

The plurality of first decoders 210_0 to 210_N generate first input enable signals EN1_0 to EN1_N, respectively, in response to the selection codes SEL<0:A>, the first set signal SET1, and the reset signal RST. If the selection codes SEL<0: A> has a corresponding value, the first decoders 210_0 to 210_N enable the first input enable signals EN1_0 to EN1_N, respectively, in response to the enabling of the first set signal SET1 and disable the first input enable signals EN1_0 to EN1_N, respectively, in response to the enabling of the reset signal RST. For example, assuming that the number of first decoders 210_0 to 210_N is 8 (that is, N=7) and the selection codes SEL<0:A> have 3 bits (that is, A=2), if the selection codes SEL<0:2> have a value of '000', the decoder 210_0 enables the first input enable signal EN1_0 in response to the enabling of the first set signal SET1 and disables the first input enable signal EN1_0 in response to the enabling of the reset signal RST. Furthermore, if the selection codes SEL<0:2> have a value of '010', the first decoder 210_2 enables the first input enable signal EN1_2 in response to the enabling of the first set signal SET1 and disables the first input enable signal EN1_2 in response to the enabling of the reset signal RST.

The plurality of first register sets 230_0 to 230_N receive the setting data DATA<0:B> loaded onto the setting data transfer bus 202 while the first input enable signals EN1_0 to EN1_N corresponding to the first register sets 230_0 to 230_N, respectively, are enabled and stores the received setting data DATA<0:B>. For example, while the first input enable signal EN1_1 is enabled, the setting data DATA<0:B>, which is loaded onto the setting data transfer bus 202, is stored in the first register set 230_1. While the first input enable signal EN1_3 is enabled, the setting data DATA<0:B>, which is loaded onto the setting data transfer bus 202, is stored in the first register set 230_3.

The plurality of second decoders 220_0~220_N generate second input enable signals EN2_0~EN2_N, respectively, in response to the selection codes SEL<0:A>, the second set signal SET2, and the reset signal RST. If the selection codes SEL<0:A> have a corresponding value, the second decoders 220_0 to 220_N enable the second input enable signals EN2_0 to EN2_N in response to the enabling of the second set signal SET2 and disable the second input enable signals EN2_0 to EN2_N in response to the enabling of the reset signal RST. For example, assuming that the number of second decoders 220_0 to 220_N is 8 (that is, N=7) and the selection codes SEL<0:A> have 3 bits (that is, A=2), if the selection codes SEL<0:2> have a value of '000', the decoder 210_0 enables the second input enable signal EN2_0 in response to the enabling of the second set signal SET2 and disables the second input enable signal EN2_0 in response to the enabling of the reset signal RST. Furthermore, if the selection codes SEL<0:2> have a value of '010', the second decoder 220_2 enables the second input enable signal EN2_2 in response to the enabling of the second set signal SET2 and disables the second input enable signal EN2_2 in response to the enabling of the reset signal RST.

The plurality of second register sets 240_0 to 240_N receives the setting data DATA<0:B> loaded onto the setting data transfer bus 202 while the second input enable signals EN2_0 to EN2_N corresponding to the second register sets 240_0 to 240_N, respectively, are enabled. For example, while the second input enable signal EN2_1 is enabled, the setting data DATA<0:B>, which is loaded onto the setting data transfer bus 202, is stored in the second register set 240_1. While the second input enable signal EN2_3 is enabled, the setting data DATA<0:B>, which is loaded onto the setting data transfer bus 202, is stored in the second register set 240_3.

The first internal circuits 250_0 to 250_N and the second internal circuits 260_0 to 260_N perform settings necessary for respective operations using setting data stored in the respective register sets 230_0 to 230_N and 240_0 to 240_N. For example, if the internal circuit 250_0 is a circuit for setting the operation mode of the integrated circuit chip, the internal circuit 250_0 may set the operation mode of the integrated circuit chip in mode A or mode B using setting data stored in the first register set 230_0. Furthermore, if the internal circuit 260_1 is a circuit for generating an internal voltage used in the integrated circuit chip, the internal circuit 260_1 may set the level of the internal voltage using setting data stored in the second register set 240_1. Furthermore, if the internal circuit 250_2 is a delay circuit for delaying a specific signal, the internal circuit 250_2 may set a delay value by using setting data stored in the register set 230_2.

In accordance with the present invention, the number of items that may be set in the integrated circuit chip, that is, the number of register sets 230_0 to 230_N and 240_0 to 240_N, may be increased by increasing the number of set signals SET1 and SET2 without increasing the number of bits of the selection codes SEL<0:A>. The first set signal SET1 is transferred to the first decoders 210_0 to 210_N, and the second set signal SET2 is transferred to the second decoders 220_0 to 220_N. As a result, an area of the first and the second set signal transfer lines 203 and 204 that are necessary to transfer the first and the second set signals SET1 and SET2 because of the increased number of set signals SET1 and SET2 may not be increased. Furthermore, since the number of bits of the selection codes SEL<0:A> remains intact as in the prior art, a change of the design of the decoders 210_0 to 210_N and 220_0 to 220_N, and an increase in the area of each decoder due to an increase in the number of bits of a signal to be decoded may be prevented.

Figure 3:
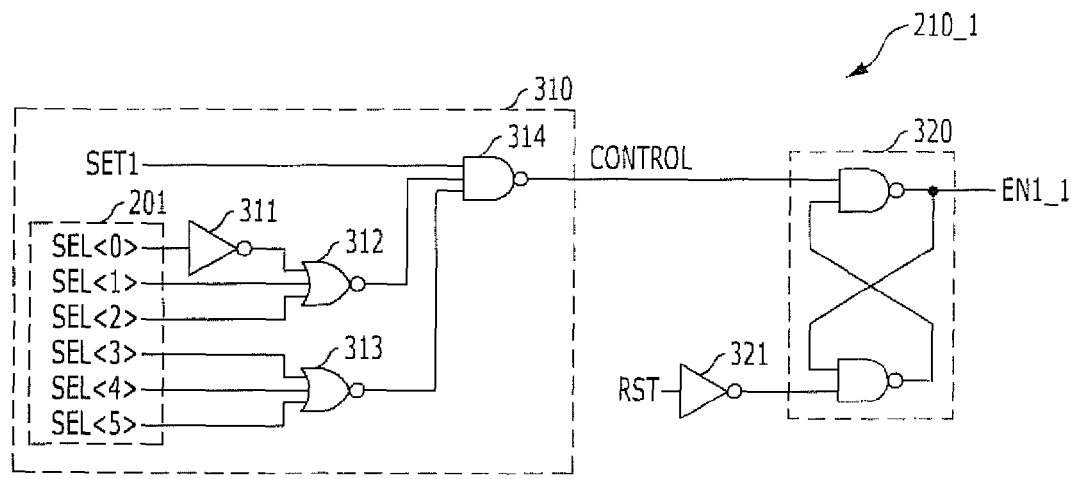
FIG. 3 illustrates a detailed diagram in accordance with an embodiment of a first decoder 210_1 of FIG. 2.

FIG. 3 illustrates a detailed circuit diagram in accordance with an embodiment of the first decoder 210_1 of FIG. 2. FIG. 3 illustrates the first decoder 210_1 when the number of bits of the selection codes SEL<0:N> is 6 bits (hereinafter referred to as SEL<0:5>) and a value of the selection codes SEL<0:5> corresponding to the first decoder 210_1 is '000001'.

Referring to FIG. 3, the first decoder 210_1 includes an enable controller 310 and an SR latch 320.

The enable controller 310 enables an enable control signal CONTROL to '0' when the selection codes SEL<0:5> has a value of '000001', and the first set signal SET1 is enabled to '1'. The enable controller 310 may include an inverter 311, NOR gates 312 and 313, and a NAND gate 314 as shown in FIG. 3.

The SR latch 320 enables the first input enable signal EN1_1 to '1' when the enable control signal CONTROL is enabled to '0' and disables the first input enable signal EN1_1 to '0' when the reset signal RST is enabled to '1' (that is, the output signal of an inverter 321 becomes '0').

Each of the first decoders other than the first decoder 210_1, which are first decoders 210_0 and 210_2 to 210_N, may have a similar construction as the first decoder 210_1 shown in FIG. 3. In the case of the first decoders 210_0 and 210_2 to 210_N, the number and positions of inverters in front of the NOR gates 312 and 313 may have to be changed depending on a corresponding value of the selection codes SEL<0:5>. Furthermore, the second decoders 220_0 to 220_N may have the same design as the first decoders 210_0 to 210_N, except that the second set signal SET2 is received instead of the first set signal SET1.

Figure 4:
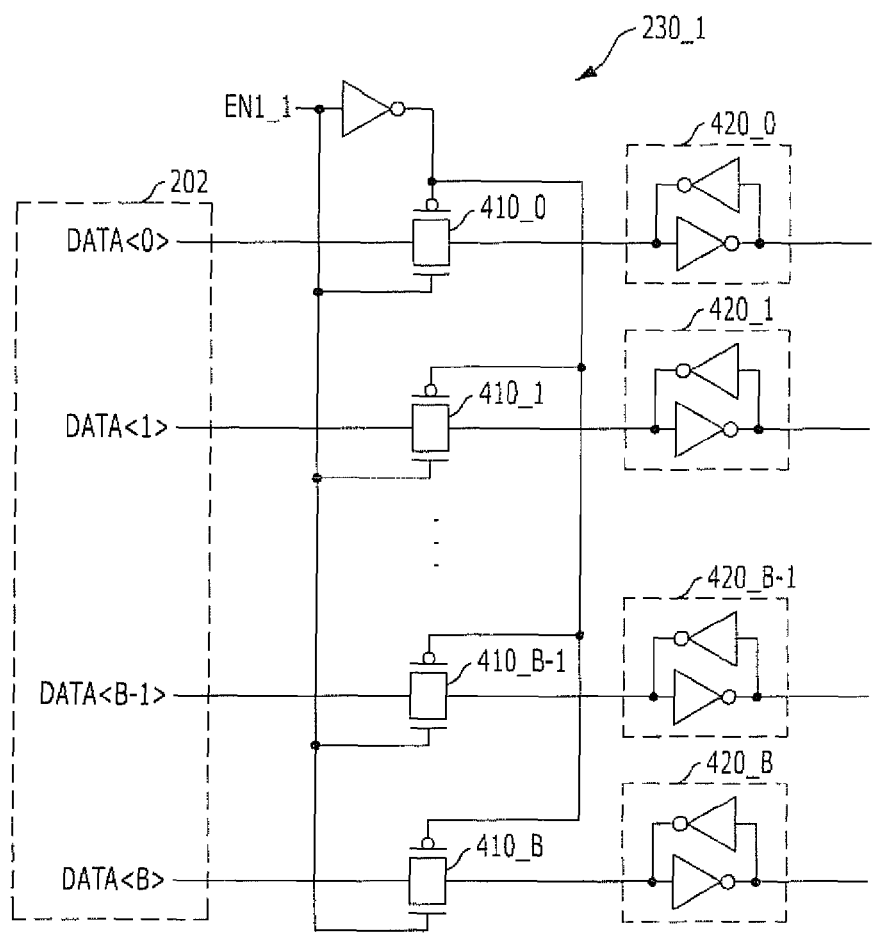
FIG. 4 illustrates a detailed diagram in accordance with an embodiment of a first register set 230_1 of FIG. 2.

FIG. 4 illustrates a detailed circuit diagram in accordance with an embodiment of the first register set 230_1 of FIG. 2.

Referring to FIG. 4, the first register set 230_1 includes pass gates 410_0 to 410_B and latches 420_0 to 420_B. Each of the latches 420_0 to 420_B has the same number of bits (B+1) of the setting data DATA<0:B>.

The pass gates 410_0 to 410_B are turned on when the first input enable signal EN1_1 is enabled to '1'. When the pass gates 410_0 to 410_B are turned on, the latches 420_0 to 420_B receive the setting data DATA<0:B>, which is loaded onto the setting data transfer bus 202, and receive the received setting data DATA<0:B>.

Each of the first register sets 230_0 and 230_2 to 230_N and the second register sets 240_0 to 240_N may have the same construction as the first register set 230_1 of FIG. 4, except that each of the input enable signals EN1_0, EN1_2 to EN1_N, and EN2_0 to EN2_N is received.

Figure 5:
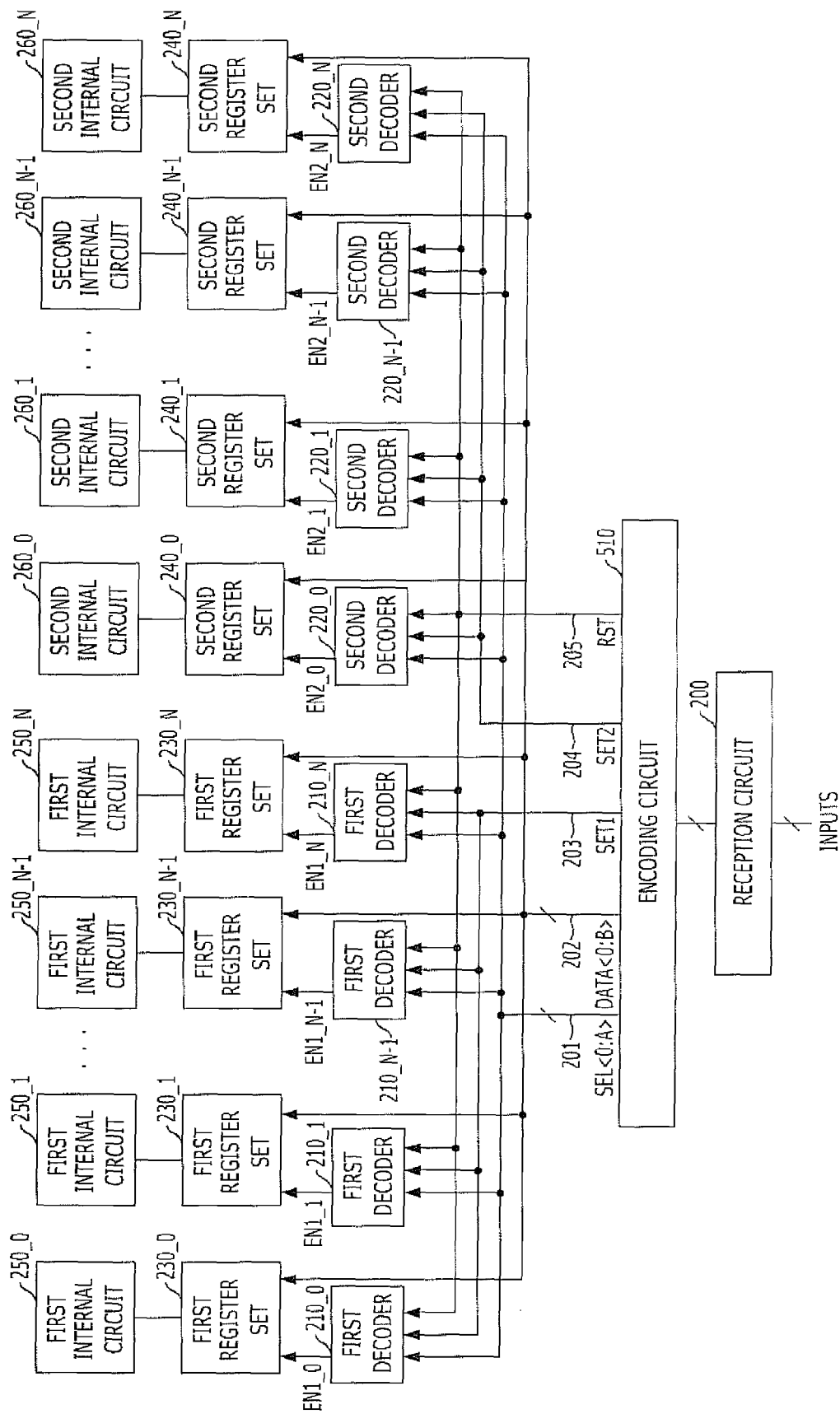
FIG. 5 illustrates a block diagram of an integrated circuit chip including a setting information storage circuit in accordance with another embodiment of the present invention.

FIG. 5 illustrates a block diagram of an integrated circuit chip including a setting information storage circuit in accordance with another embodiment of the present invention.

The embodiment of FIG. 5 further includes an encoding circuit 510 in the embodiment of FIG. 4. Codes and signals for setting the integrated circuit chip may be directly received from a source other than the integrated circuit chip as in the embodiment of FIG. 4, but may be internally generated by encoding signals INPUTS externally received through a reception circuit 200. The encoding circuit 510 generates codes and signals SEL<0:A>, DATA<0:B>, SET1, SET2, and RST for setting the integrated circuit chip by using the signals INPUTS received from the outside of the integrated circuit chip. That is, the encoding circuit 510 may generate the codes and signals SEL<0:A>, DATA<0:B>, SET1, SET2, and RST by changing a format of the external signals INPUTS. For example, in a memory device, such as DRAM, signals for setting the memory device may be received through a command channel and an address channel, and the codes and signals SEL<0:A>, DATA<0:B>, SET1, SET2, and RST for setting within the memory device are generated by using the received signals.

In accordance with yet another embodiment (not shown), an e-fuse array circuit and nonvolatile memory, such as flash memory, are included in an integrated circuit chip, and the codes and signals SEL<0:A>, DATA<0:B>, SET1, SET2, and RST for setting the integrated circuit chip may be generated by using information stored in the nonvolatile memory.

That is, the codes and signals SEL<0:A>, DATA<0:B>, SET1, SET2, and RST for setting the integrated circuit chip may be directly received from a source other than the integrated circuit chip (for example, FIG. 4), may be internally generated within the integrated circuit chip by using external signals (for example, FIG. 5), or may be internally generated within the integrated circuit by using information stored in the integrated circuit chip.

In accordance with the present invention, the number of items that can be set may be increased by increasing the number of set signals. Accordingly, the number of bits of selection codes and the construction of a decoder may not have to be changed, because the concerns raised by an increase in the area of a circuit and a change of the design may be alleviated.

While the present invention has been described with respect to the specific embodiments, it will be apparent to those skilled in the art that various changes and modifications may be made without departing from the spirit and scope of the invention as defined in the following claims.

What is claimed is:

1. An integrated circuit chip, comprising:
    a selection code transfer bus configured to transfer selection codes;
    a setting data transfer bus configured to transfer setting data;
    a first line configured to transfer a first set signal;
    a second line configured to transfer a second set signal;
    a plurality of first decoders configured to generate a plurality of first input enable signals, respectively, in response to the selection codes and a first set signal;
    a plurality of first register sets configured to correspond to the plurality of first decoders, respectively, and to receive the setting data when the first input enable signals generated from the first decoders corresponding to the first register sets, respectively, are enabled, and to store the received setting data;
    a plurality of second decoders configured to generate a plurality of second input enable signals, respectively, in response to the selection codes and the second set signal;
    a plurality of second register sets configured to correspond to the plurality of second decoders, respectively, and to receive the setting data when the second input enable signals generated from the plurality of second decoders corresponding to the second register sets, respectively, are enabled, and to store the received setting data;
    a reception circuit configured to receive a plurality of signals externally; and
    an encoding circuit configured to generate the selection codes, the setting data, the first set signal, and the second set signal by using the plurality of signals received through the reception circuit.

2. The integrated circuit chip of claim 1, further comprising a third line configured to transfer a reset signal, wherein each of the plurality of first decoders disables each of the first input enable signals when the reset signal is enabled.

3. The integrated circuit chip of claim 2, wherein each of the plurality of first register sets comprises a plurality of registers configured to receive respective signals that form the setting data when the first input enable signal is enabled and stores the received signals.

4. The integrated circuit chip of claim 2, wherein each of the plurality of first decoders comprises:
    an enable controller configured to generate an enable control signal in response to the selection codes and the first set signal; and
    an SR latch configured to enable the first input enable signal in response to the enable control signal and disable the first input enable signal in response to the reset signal.

* * * * *